United States Patent
Audet et al.

(10) Patent No.: US 7,312,523 B2
(45) Date of Patent: Dec. 25, 2007

(54) ENHANCED VIA STRUCTURE FOR ORGANIC MODULE PERFORMANCE

(75) Inventors: Jean J. Audet, Quebec (CA); Jon A. Casey, Poughkeepsie, NY (US); Luc Guerin, Quebec (CA); David L. Questad, Hopewell Junction, NY (US); David J. Russell, Owego, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/161,285

(22) Filed: Jul. 28, 2005

(65) Prior Publication Data
US 2007/0023913 A1    Feb. 1, 2007

(51) Int. Cl.
*H01L 23/053* (2006.01)
*H01L 23/12* (2006.01)
*H01L 23/48* (2006.01)

(52) U.S. Cl. ............ 257/700; 257/701; 257/774; 257/E23.011

(58) Field of Classification Search ........ 257/700–702, 257/758, 698, 774
See application file for complete search history.

(56) References Cited
U.S. PATENT DOCUMENTS

| | | | |
|---|---|---|---|
| 5,162,260 A | 11/1992 | Leibovitz et al. | |
| 5,699,613 A | 12/1997 | Chong et al. | |
| 5,758,413 A | 6/1998 | Chong et al. | |
| 5,899,738 A | 5/1999 | Wu et al. | |
| 6,277,761 B1 | 8/2001 | Diewald et al. | |
| 6,369,443 B1 | 4/2002 | Baba | |
| 6,737,748 B2 | 5/2004 | Bauch et al. | |
| 6,831,363 B2 | 12/2004 | Dalton et al. | |
| 6,838,314 B2 | 1/2005 | Chang | |
| 2003/0178229 A1* | 9/2003 | Toyoda et al. | 174/261 |
| 2004/0177999 A1* | 9/2004 | Saiki et al. | 174/263 |

\* cited by examiner

*Primary Examiner*—Nitin Parekh
(74) *Attorney, Agent, or Firm*—Gibb & Rahman, LLC; Joseph Petrokaitis, Esq.

(57) ABSTRACT

A circuit board comprises a resin-filled plated (RFP) through-hole; a dielectric layer over the RFP through-hole; a substantially circular RFP cap in the dielectric layer and connected to an upper opening of the RFP through-hole; a via stack in the dielectric layer; and a plurality of via lands extending radially outward from the via stack, wherein each of the plurality of via lands is diametrically larger than the RFP cap. Preferably, the RFP cap comprises a diameter of at least 300 μm. Preferably, each of the via lands comprises a substantially circular shape having a diameter of at least 400 μm. Moreover, the circuit board further comprises a ball grid array pad connected to the via stack; and input/output ball grid array pads connected to the ball grid array pad. Additionally, the circuit board further comprises metal planes in the dielectric layer.

20 Claims, 2 Drawing Sheets

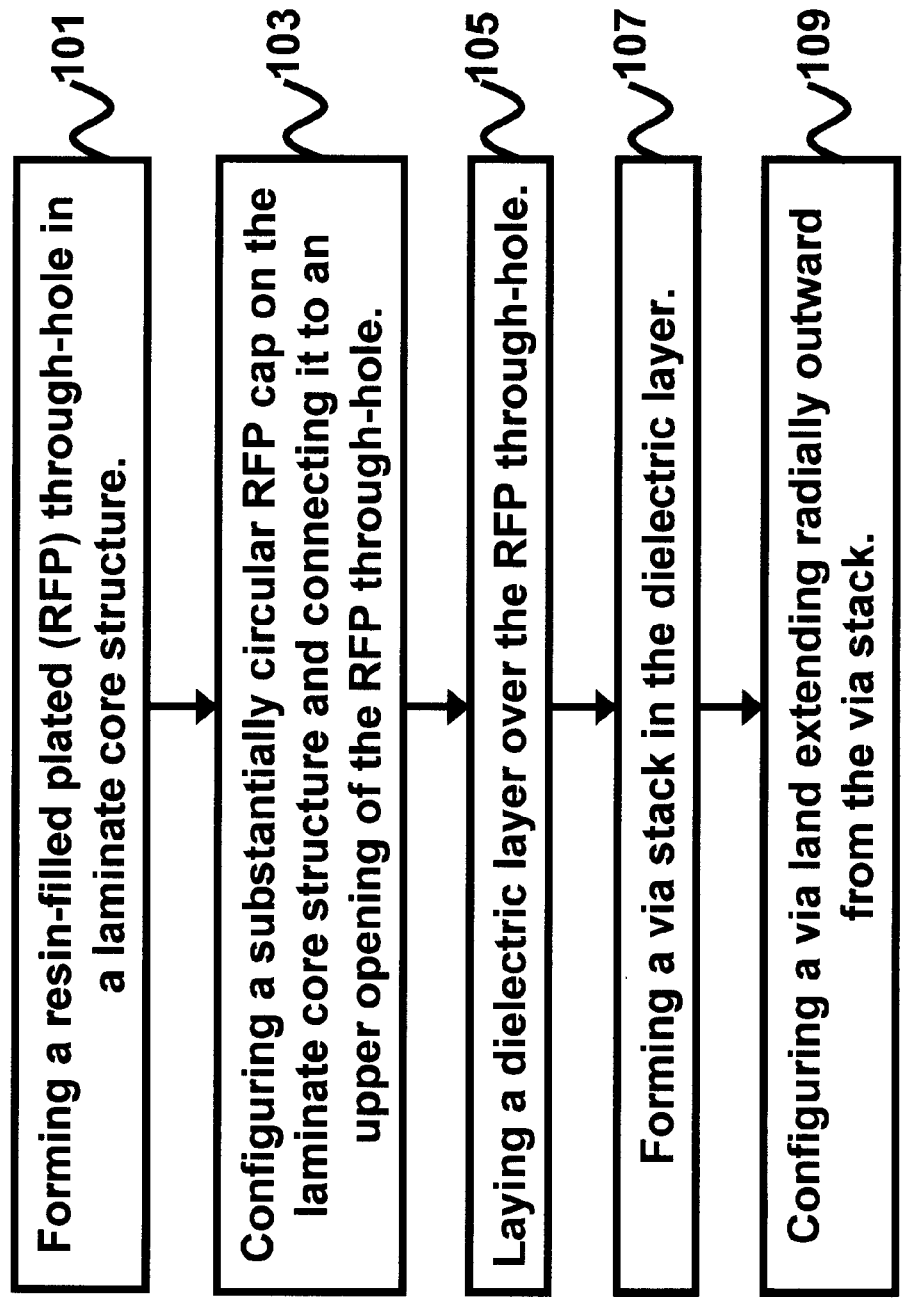

ENHANCED VIA STRUCTURE FOR ORGANIC MODULE PERFORMANCE

BACKGROUND OF THE INVENTION

1. Field of the Invention

The embodiments of the invention generally relate to integrated circuit systems, and, more particularly, to stacked via integrated circuit structures.

2. Description of the Related Art

The use of stacked vias on resin filled plated thru-holes (RFPs) in build-up flip chip package ball grid array (FCP-BGA) laminate chip carriers are known areas of high stress in high performance organic modules. The mismatch in the coefficient of thermal expansion (CTE) generally results in an area of high stress in the stacked vias on the RFPs. The stress tends to be higher when the number of stacked vias increases (1, 2, and 3 stacked vias). As the module performance requirements increase and higher wireability is needed, multi-high stacked vias are generally required in the design of most organic modules. However, failure at the stacked vias on RFP continues to be a significant problem with this technology leading to reduced reliability.

RFPs are formed by drilling holes in a laminate core structure and plating the inside of the holes with copper. Next, the remaining holes are filled with a filled epoxy resin, and a layer of copper is plated over the resin fill. After circuitizing the copper layer, which includes forming lines and a disk shaped RFP land over the RFP, a layer of dielectric material is applied, vias are formed in the dielectric layer using laser ablation, and the dielectric layer is circuitized using a pattern plating process. The result is a circuitized layer containing solid copper interconnect vias. At the top of this via is a relatively larger area of plated copper, called a land. Next, this process is repeated as many times as needed to build the structure (i.e., two additional times for a total of three build-up layers). At each step, there is a larger disk of copper plated over the via hole, called a via land, which allows for registration shifts in the next layer as the structure is built. These via lands are typically about 100 μm in diameter, while the RFP lands can be typically 250 μm in diameter.

An additional reliability concern is from mechanical damage to the module-through test, inspection, etc., after assembly. Furthermore, using improper handling techniques while inserting or removing modules from test sockets can put a strain on the BGA ball. Since the BGA balls are connected directly to the RFP cap through the stacked vias, this strain may result in a separation of the via stack from the RFP cap copper. Another common failure mode for stacked vias on RFPs is due to the lifting of the input/output (I/O) pad that the stacked via connect to, and the resulting tear-out of the underlying dielectric layer. Tear-out of the I/O pad is commonly observed for conventional stacked vias on RFPs. Tear-out commonly occurs when there are no copper planes under the I/O pad. Moreover, tear-out occurs where there are large openings in the planes below the BGA pad, and intermetallic fails occur when the planes below the BGA pads are connected to the via stack or have small clearance openings. Therefore, there remains a need for a novel via structure for enhanced organic module performance, which overcomes the limitations of the conventional structures.

SUMMARY OF THE INVENTION

In view of the foregoing, an embodiment of the invention provides a circuit board comprising a resin-filled plated (RFP) through-hole; a dielectric layer over the RFP through-hole; a substantially circular RFP cap in the dielectric layer and connected to an upper opening of the RFP through-hole; a via stack in the dielectric layer; and a plurality of via lands extending radially outward from the via stack, wherein each of the plurality of via lands is diametrically larger than the RFP cap. Preferably, the RFP cap comprises a diameter of at least 300 μm. Preferably, each of the via lands comprises a substantially circular shape having a diameter of at least 400 μm. Moreover, the circuit board further comprises a ball grid array pad connected to the via stack; and input/output ball grid array pads connected to the ball grid array pad. Additionally, the circuit board further comprises metal planes in the dielectric layer.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 2 is a flow diagram illustrating a preferred method according to an embodiment of the invention.

DETAILED DESCRIPTION OF PREFERRED EMBODIMENTS OF THE INVENTION

Figure 1:
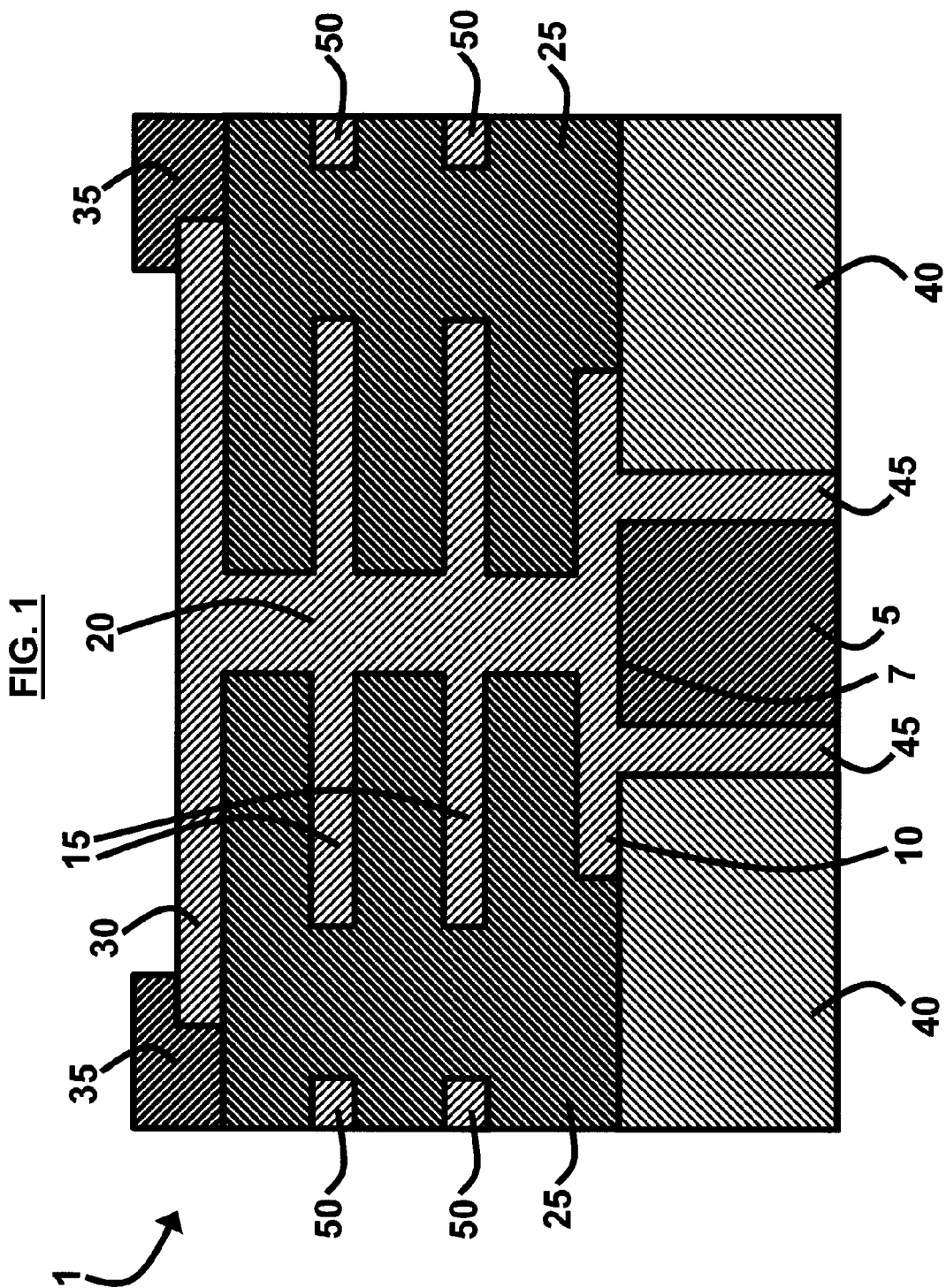
FIG. 1 illustrates a cross-sectional schematic diagram of a circuit board structure according to an embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for a novel via structure for enhanced organic module performance, which overcomes the limitations of the conventional structures. The embodiments of the invention achieve this by providing a circuit board adapted for enhanced organic module performance. Referring now to the drawings, and more particularly to FIGS. 1 and 2, there are shown preferred embodiments of the invention.

FIG. 1 illustrates a circuit board 1 comprising a resin-filled plated (RFP) through-hole 5; a dielectric layer 25 over the RFP through-hole 5; a substantially circular RFP cap 10 in the dielectric layer 25 and connected to an upper opening 7 of the RFP through-hole 5; a via stack 20 in the dielectric layer 25; and a plurality of via lands 15 extending radially outward from the via stack 20, wherein each of the plurality of via lands 15 is diametrically larger than the RFP cap 10. Preferably, the RFP cap 10 comprises a diameter of at least 300 μm, and wherein each of the via lands 15 comprises a substantially circular shape having a diameter of at least 400 μm.

The circuit board 1 further comprises input/output solderball array (not shown) connected to a BGA pad 30, which is connected to the via stack 20. Moreover, the circuit board 1 further comprises a solder mask 35 connected to the dielectric layer 25 and the BGA pad 30. Additionally, the circuit board 1 further comprises a RFP metal layer 45, preferably comprising copper, connected to the RFP cap 10 and positioned beneath the dielectric layer 25, wherein the RFP metal layer 45 cylindrically encircles the RFP through-hole 5. Also, the circuit board 1 further comprises a laminate core structure 40 adjacent to the dielectric layer 25 and the RFP metal layer 45. Additional metal planes or lines 50 preferably comprising copper and positioned in the dielectric layer 25 is further illustrated in FIG. 1.

As previously mentioned, tear-out commonly occurs when there are no copper planes under the I/O pad. Accordingly, the embodiments of the invention provide metal (e.g., copper) via lands 15 under the I/O plane 30, whereby the metal via lands 15 act as a reinforcement to the structure 1, reducing or eliminating I/O pad tear-out. In FIG. 1, the BGA pad 30 forms an electrical connection to the stacked via 20. The second via land used in the via stack 20 includes a clearance space (shown in FIG. 1, as a gap between land 15 and plane 50) at the via stack 20 such that the electrical connection to the stacked via 20 and the metal plane/line 50 is avoided. Accordingly, the embodiments of the invention improve the mechanical behavior of the stacked via in terms of tear-out behavior. Furthermore, the embodiments of the invention allow one to use reinforcing layers (lands 15) under the I/O pads 30 that either are electrically connected to the stacked vias 20 or electrically isolated. Thus, all vias in the via stack 20 on RFPs 5 can utilize the embodiments of the invention to improve the mechanical performance of the circuit board 1.

The difference in the clearance of the lands 15 below the BGA pad 30 is significant. The large plane openings (e.g., the space between plane 50 and the opposite edge of plane 50) are required for BGA's terminating high speed serial (HSS) conductors. The presence of lands 15 below the BGA pads 30 can degrade the electrical performance of the HSS conductors by increasing the return loss of the net. However, it is demonstrated that the presence of lands 15 connected to the via stack 20 or having small clearance openings (e.g., the space between plane 50 and the opposite edge of plane 50) (therefore more overlap under the BGA pad 30) clearly adds to the mechanical robustness and significantly reduces the failure rate.

With regard to the effect of the use of metal lands 15 on the HSS electrical performance, electrical modeling suggests that the electrical performance of the HSS lines degrade as the clearance under the BGA pad 30 is reduced. Thus, the embodiments of the invention provide an optimum design point which can increase the mechanical robustness of these BGA pads 30 on stacked via structures 20 without significantly degrading the electrical impact of the HSS conductors (not shown).

In accordance with the embodiments of the invention, mechanical modeling is performed by looking at the structural deformation as a function of a side load applied to the BGA pad 30 as a function of increasing via land size. As an unexpected result, it was experimentally determined that increasing the size of the via land 15 reduces the deformation, therefore imparting mechanical robustness and reducing the impact of mechanical handling on via stack 20 fails. Electrical modeling also demonstrates that the impact to the electrical performance of increasing the size of the via land 15 is significantly less than reducing the clearance in the lands 15 below the BGA pad 30 or connecting the lands 15 to the via stack 20. It is also determined that increasing the diameter of the via lands 15 in the middle of the via stack 20 offers a greater improvement than increasing the RFP land 10.

Generally, the embodiments of the invention provide a stacked via structure 20 having lands 15 connected to the via stack 20 below the BGA pad 30 resulting in increased mechanical robustness of the via stack 20. Moreover, the embodiments of the invention provide a stacked via structure 20 offering mechanical robustness against mechanical damage, resulting from either differential material CTE or handling damage without significantly degrading the electrical performance of signal lines, specifically HSS lines.

This increased robustness is achieved by (a) increasing the diameter of the via land 15 to a size of 400 μm; and (b) increasing the diameter of the RFP land 10 to a size of 300 μm. The increased diameters provide more mechanical robustness against side load shear stresses. Furthermore, the embodiments of the invention provides a method of optimizing the via stack 20 for electrical and mechanical performance on a given design, or a specific net by iterative mechanical modeling and electrical simulation. The specific numeric values for the diameters of the via land 15 and RFP land 10 may be altered depending on the electrical performance criteria and the reliability and mechanical robustness requirements. Moreover, the embodiments of the invention provides an optimized solution to address the need for addressing the trade-off between electrical performance (where smaller lands are better) and mechanical robustness (where larger lands are better).

FIG. 2 (with reference to FIG. 1) illustrates a flow diagram of a preferred method of making a circuit board 1, wherein the method comprises forming (101) a resin-filled plated (RFP) through-hole 5 in a laminate core structure 40; configuring (103) a substantially circular RFP cap 10 on the laminate core structure 40 and connecting it to an upper opening 7 of the RFP through-hole 5; laying (105) a dielectric layer 25 over the RFP through-hole 5; forming (107) a via stack 20 in the dielectric layer 25; and configuring (109) a via land 15 extending radially outward from the via stack 20, and repeating processes (103), (105), (107), and (109) such that each of a plurality of via lands 15 in the via stack 20 is diametrically larger than the RFP cap 10. Preferably, the RFP cap 10 is dimensioned and configured to have a diameter of at least 300 μm, and wherein each of the via lands 15 is dimensioned and configured in a substantially circular shape having a diameter of at least 400 μm. The method further includes connecting input/output ball grid array pads 30; forming a solder mask layer 35 on the dielectric layer 25 and the uppermost via land 30, and connecting a RFP metal 45 to the RFP cap 10 and positioning the RFP metal 45 beneath the dielectric layer 25, wherein the RFP metal 45 cylindrically encircles the RFP through-hole 5. Also, laminate core structure 40 is configured adjacent to the dielectric layer 25 and the RFP metal 45. Additional metal planes or lines 50 may be configured in the dielectric layer 25 as well.

The embodiments of the invention can be formed into integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A circuit board comprising:
a laminate core substrate:
a resin-filled plated (RFP) through-hole having an upper surface planar to an upper surface of said laminate core substrate;
a metal layer encircling and contacting said RFP through-hole;
a dielectric layer over said RFP through-hole and contacting said laminate core substrate;
a substantially circular RFP cap in said dielectric layer and connected to said metal layer and an upper opening of said RFP through-hole, wherein said RFP cap comprises a diameter of at least 300 μm;
a via stack in said dielectric layer, wherein said via stack is positioned over a substantially central portion of said RFP through-hole and said RFP cap;
a plurality of circular via lands extending radially outward from said via stack, wherein each of said plurality of circular via lands comprise an equivalent diameter and are aligned over a substantially central portion of said RFP through-hole and said RFP cap, and wherein a diameter of each of said plurality of circular via lands exceeds a diameter of each of said RFP through-hole and said RFP cap; and
a ball grid away pad connected to said via stack, wherein said ball grid array pad is positioned over a substantially central portion of said RFP through-hole and over a substantially central portion of said via stack, and wherein said ball grid array pad is diametrically larger than each of said plurality of via lands and said RFP cap.

2. The circuit board of claim 1, wherein each of said via lands comprises a substantially circular shape having a diameter of at least 400 μm.

3. The circuit board of claim 1, wherein said via stack is centrally positioned over and within an area defined by an interior of said metal layer where said RFP through-hole resides.

4. The circuit board of claim 1, further comprising a solder mask connected to said ball grid array pad.

5. The circuit board of claim 1, further comprising input/output ball grid array pads connected to said ball grid array pad.

6. The circuit board of claim 1, further comprising metal planes in said dielectric layer.

7. A circuit board comprising:
a laminate core substrate;
a resin-filled plated (RFP) through-hole having an upper surface planar to an upper surface of said laminate core substrate;
a metal layer encircling and touching said RFP through-hole;
a dielectric layer over said RFP through-hole and contacting said laminate core substrate;
a substantially circular RFP cap in said dielectric layer and connected to said metal layer and said RFP through-hole;
a via stack in said dielectric layer, wherein said via stack is positioned over a substantially central portion of said RFP through-hole and said RFP cap;
a plurality of via lands extending radially outward from said via stack, wherein each of said via lands comprises a substantially circular shape having a diameter of at least 400 μm, and wherein each of said plurality of circular via lands comprise an equivalent diameter and are aligned over a substantially central portion of said RFP through-hole and said RFP cap, and wherein a diameter of each of said plurality of circular via lands exceeds a diameter of each of said RFP through-hole and said RFP cap; and
a ball grid away pad connected to said via stack, wherein said ball grid array pad is positioned over a substantially central portion of said RFP through-hole and over a substantially central portion of said via stack, and wherein said ball grid array pad is diametrically larger than each of said plurality of via lands and said RFP cap.

8. The circuit board of claim 7, wherein said RFP cap comprises a diameter of at least 300 μm.

9. The circuit board of claim 7, wherein said via stack is centrally positioned over and within an area defined by an interior of said metal layer where said RFP through-hole resides.

10. The circuit board of claim 7, further comprising a solder mask connected to said ball grid array pad.

11. The circuit board of claim 10, wherein said RFP through-hole is positioned below a substantially central portion of said ball grid array pad.

12. The circuit board of claim 7, further comprising input/output ball grid array pads connected to said ball grid array pad.

13. The circuit board of claim 7, further comprising metal planes in said dielectric layer.

14. A circuit board comprising:
a laminate core substrate;
a resin-filled plated (RFP) through-hole having an upper surface planar to an upper surface of said laminate core substrate;

a metal layer encircling and contacting said RFP through-hole;

a dielectric layer over said RFP through-hole and contacting said laminate core substrate;

a circular RFP cap in said dielectric layer and connected to said metal layer and said RFP through-hole;

a via stack in said dielectric layer, wherein said via stack is positioned over a substantially central portion of said RFP through-hole and said RFP cap;

a plurality of circular via lands extending radially outward from said via stack, wherein each of said plurality of via lands is diametrically larger than said RFP cap and said RFP through-hole, and wherein each of said plurality of circular via lands comprise an equivalent diameter and are aligned over a central portion of said RFP through-hole and said RFP cap; and a ball grid away pad connected to said via stack, wherein said ball grid array pad is positioned over a substantially central portion of said RFP through-hole and over a substantially central portion of said via stack, and wherein said ball grid array pad is diametrically larger than each of said plurality of via lands and said RFP cap.

15. The circuit board of claim 14, wherein said RFP cap comprises a diameter of at least 300 μm.

16. The circuit board of claim 14, wherein each of said via lands comprises a diameter of at least 400 μm.

17. The circuit board of claim 14, further comprising a solder mask connected to said ball grid array pad.

18. The circuit board of claim 17, wherein said RFP through-hole is positioned below a substantially central portion of said ball grid array pad.

19. The circuit board of claim 14, further comprising input/output ball grid array pads connected to said ball grid array pad.

20. The circuit board of claim 14, further comprising metal planes in said dielectric layer.

* * * * *